United States Patent
Rausch

Patent Number: 4,583,483
Date of Patent: Apr. 22, 1986

[54] MECHANICAL METER TAMPERING INDICATOR

[75] Inventor: Roger A. Rausch, Plymouth, Minn.

[73] Assignee: Honeywell Inc., Minneapolis, Minn.

[21] Appl. No.: 793,450

[22] Filed: Oct. 28, 1985

Related U.S. Application Data

[63] Continuation of Ser. No. 429,353, Sep. 30, 1982, abandoned.

[51] Int. Cl.⁴ ............................................. G08B 13/14
[52] U.S. Cl. .................................. 116/204; 116/100; 324/110
[58] Field of Search ............... 116/204, 206, 100, 200, 116/87, 5, DIG. 41, 212, 214; 324/110

[56] References Cited

U.S. PATENT DOCUMENTS

| | | | |
|---|---|---|---|
| 779,450 | 1/1905 | Wagner | 116/87 |
| 1,050,637 | 1/1913 | Fyfe | 116/87 |
| 1,294,867 | 2/1919 | Brook | 116/87 |
| 1,632,893 | 6/1927 | Glaus | 116/87 |
| 2,196,961 | 4/1940 | Epstein | 116/87 |
| 2,366,870 | 6/1941 | Palmer et al. | 140/145 |
| 2,601,440 | 6/1952 | Kerrigan | 116/114 |
| 3,414,415 | 12/1968 | Broad | 116/219 |
| 3,441,304 | 4/1969 | Chidley | 116/206 |
| 3,835,809 | 9/1974 | Sinn, Jr. | 116/114 |
| 3,915,112 | 10/1975 | Forester | 116/124 R |
| 4,039,943 | 8/1977 | Tapscott | 324/110 |
| 4,080,567 | 3/1979 | Kemp et al. | 324/110 |
| 4,143,615 | 3/1979 | Nagy | 116/46 |
| 4,150,371 | 4/1979 | Scaglione | 340/568 |
| 4,230,450 | 10/1980 | Le Fever | 116/5 |
| 4,327,324 | 4/1982 | Welz | 324/110 |

*Primary Examiner*—Charles Frankfort
*Assistant Examiner*—Denis E. Corr
*Attorney, Agent, or Firm*—Charles G. Mersereau

[57] ABSTRACT

An apparatus for indicating meter tampering in a plug in meter with a transparent cover such as a watthour meter is disclosed which includes a spring loaded "mouse trap" mechanism including a tyne member adapted to be released so as to strike and rupture a dye-filled frangible container upon a tampering incident to indicate tampering.

10 Claims, 3 Drawing Figures

U.S. Patent  Apr. 22, 1986  4,583,483
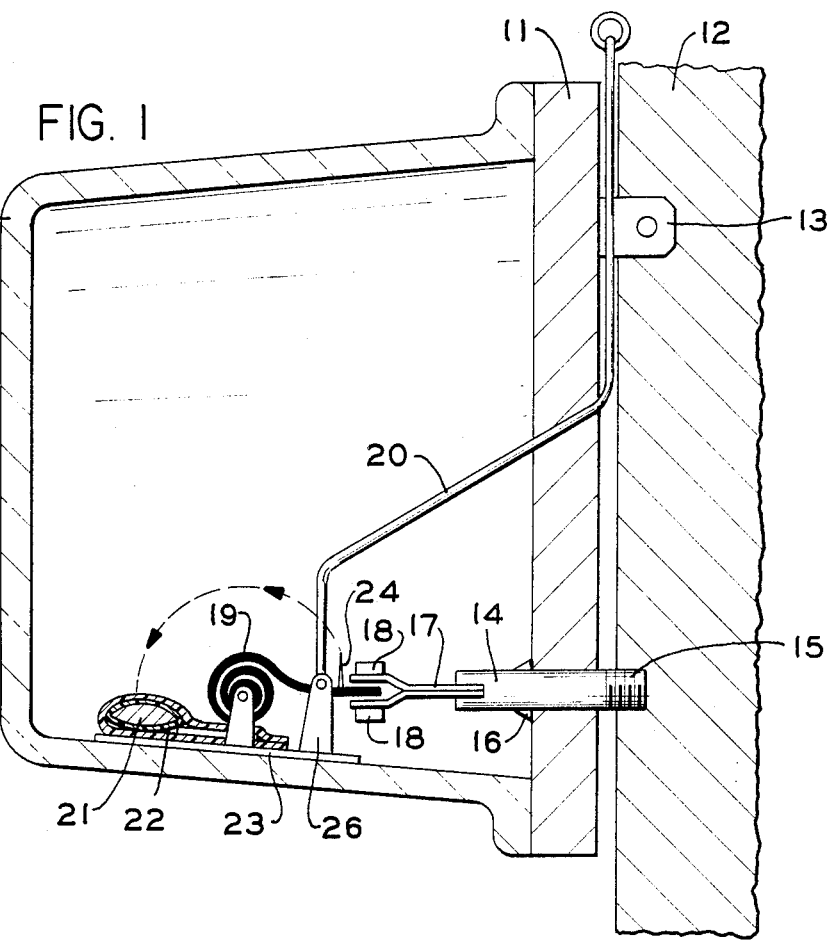
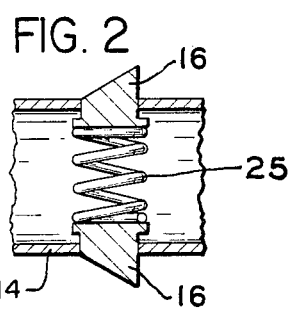
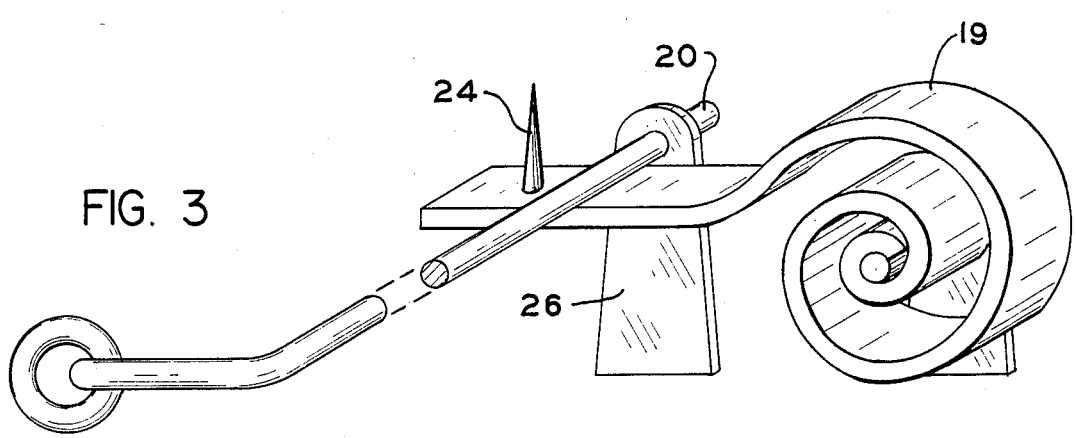

MECHANICAL METER TAMPERING INDICATOR

This application is a continuation of application Ser. No. 429,353 filed Sept. 30, 1982, now abandoned.

BACKGROUND OF THE INVENTION

1. Field of the Invention

The present invention relates generally to devices adapted to disclose or discourage tampering with electric meters and, in particular, a device which indicates or communicates meter tampering by any of several methods including removal of the meter from the socket, removal of the cover from the meter, magnetic interference or impact. This is accomplished by the use of a sensitive spring-loaded "trap" device.

2. Description of the Prior Art

The use of induction type watthour meters installed in meter sockets at customers' sites is well known in the electric utility metering field. Total electrical energy consumption is indicated on one or more register dials on the watthour meter which are driven by a geared disk which, in turn, is driven by a shunt induction motor. This system continually increments the dial or dials to show total electrical energy use. The dial or dials are read periodically for the purposes of billing by utility companies. Thus, the dial on the electric watthour meter is normally the only check which the utility company has pertaining to the total electric energy consumption by a particular customer. This has led to widespread tampering with watthour meters in an effort to reduce the indicated consumption and thereby defraud the utility company through indication of less-than-actual power consumption. The Edison Electric Institute (EEI) estimates that the total United States utility industry loses more than four hundred million dollars annually to meter cheaters. Other estimates by utility experts run as high as two billion dollars annually.

A large share of the meter tampering is done by residential and commercial customers with single phase induction watthour meters. Of the more than twenty-five commonly detected methods of meter tampering, more than two-thirds of these require either removal of the meter from its socket or removal of the cover glass. Other common methods involve impact to the meter or magnetic interference with the disc drive mechanism. In a publication entitled "Meter Tampering Report" published in June 1978 by Texas Electric Cooperatives, Inc. it is estimated that the above overt methods account for about 85% of the total meter tamperings. Other, more subtle, methods account for the remainder.

In one well known method of meter tampering which involves removal from its socket, the meter is reinstalled in an upside down position so that the terminals are reversed and the meter registers are caused to run in reverse. This reduces the total indicated power consumption without interruption of the power supply to the user. Other popular methods include delivering a blow to the meter such that the induction drive system is permanently disturbed and the mechanism runs at a slower rate for a given amount of power throughput, and using an external magnet to slow or even stop the operation of the induction disk drive system. In some cases the glass is removed and the dial readings changed or the operation of the mechanism otherwise interfered with to affect the meter reading.

One clever prior art approach to the problem associated with reinserting the meter upside down is disclosed in U.S. Pat. No. 4,039,943 issued Aug. 2, 1977. By that invention the meter is equipped with a gravity switch which together with an auxiliary magnet cooperates not only to cause the meter to operate in the forward direction when installed upside down, but also causes it to run at a greater rate than that indicated by the actual power consumed, thereby penalizing the defrauder. Another device is disclosed in U.S. Pat. No. 3,915,112, issued Oct. 28, 1975.

Various other devices such as that depicted in the U.S. Pat. No. 4,150,371 issued Apr. 17, 1979 have also been utilized in an attempt to stop the other common methods of defrauding the power company. However, there remains a definite need for a type of device which is low cost, easy to install and prevents most or all of the most common methods of meter tampering.

SUMMARY OF THE INVENTION

In accordance with the present invention there is provided an electro-mechanical meter tampering detector and indicator which is sensitive to removal of the meter, removal or rotation of the glass cover, impacts to the meter and the presence of external magnets.

The invention includes a first subassembly fixed to the meter base and a second subassembly fixed to the cover of the meter. The two subassemblies cooperate to create a "mousetrap" like indicating device.

The first subassembly of the invention includes a retaining pin assembly connected through the mechanism mounting base of the watthour meter to the permanently mounted base. A pair of spring-loaded detent pins are provided to prevent removal of the meter from the base once the retaining pin assembly is installed in the base and the meter plugged in over it. The retaining pin further supports a pair of rotatable reed springs each of which carries an external magnet. The second subassembly of the system is mounted on the glass cover and includes a main coil spring which has a tyne or sharp piercing instrument mounted thereon, a vessel containing a staining liquid disposed in relation to the spring such that the tyne attached to the spring pierces the vessel upon release of the spring. Once assembled the spring is disposed relative to the retaining pin such that it is held in abeyance by the reed springs until a disturbance causes a change in their relative position thereby releasing the coiled spring in the manner of a mousetrap to thereby cause the tyne to pierce or break the vessel to indicate tampering.

The retaining pin is installed by being screwed into a tapped hole drilled into the meter base or otherwise fastened to the permanent meter base. The meter mechanism mounting base on the meter is provided with a coincident hole such that the meter is installed over the retaining pin. Thus, when the meter is plugged into the socket, the meter base in inserted over the retaining pin assembly and is retained by the detents. The spring-loaded detents are tapered to provide easy insertion of the base as well as a positive lock against removal of the mechanism mounting member once installed. The cover glass is inserted over the mounting base such that the main coil spring is received between the reed springs. For the purposes of assembly and installation, the main coil spring may be held in place by an externally operable arming wire inserted through a member mounted adjacent the spring to facilitate assembly and then released to be held in place the force of the reed springs upon removal of the arming wire. Thus, any disturbance which causes the reed springs to rotate or which displaces the main spring with respect to the reed springs will occasion the main spring to snap back causing the tyne to pierce or break the vessel and allowing the liquid to stain the chamber or indicating pad thereby indicating that a tampering event or attempted tampering event has taken place with respect to the meter.

In this manner, the system will react to magnetic interference which causes the reed springs to rotate, any rotating or removal of the glass cover plate with respect to the base member and, of course, the detent pins prevent unplugging of the meter itself without damage to the retaining pin assembly.

BRIEF DESCRIPTION OF THE DRAWINGS

In the drawings wherein like numerals are utilized to designate like parts throughout the same:

FIG. 1 is a sectional view through a typical watthour meter showing the meter tampering system of the invention mounted therein;

FIG. 2 is a detail of the detent pins of the embodiment in FIG. 1; and

FIG. 3 is a detail view of the spring mechanism of the invention in accordance with FIG. 1.

DESCRIPTION OF THE PREFERRED EMBODIMENT

In FIG. 1 there is shown a sectional view intended to depict a typical single-phase induction watthour meter. The meter is shown without the electrical metering mechanism to more conveniently depict the anti-tampering device of the present invention. The meter includes a heavy cover glass 10 attached to the mechanism support member 11 which, in turn, plugs electrically into a permanently mounted base member 12 utilizing a multiple of electrical blades, one of which is shown at 13, in a well known manner.

The anti-tampering device of the invention includes a connecting pin subassembly which has a retaining pin 14 which may be threadably attached or screwed into a hole drilled and tapped in the base member 12 as at 15. It further includes a pair of detent pins 16, a pair of rotatable reed-type springs 17 which are provided with a pair of magnets 18 attached thereto. The remaining parts of the device comprise a second subassembly and are fastened directly or indirectly to the glass cover. They include a main spring 19, an arming wire mount 20, and an indicator assembly which includes a bag 21 of plastic or other easily pierced material and which may contain a special colored fluid and an absorbant pad 22. This assembly may be mounted on a base 23 which is, in turn, glued or otherwise mounted to the inner surface of the glass cover 10. The spring 19, as better shown in FIG. 3, is equipped with a sharp tyne 24.

Details of the detent pins are shown better in fragmentary sectional view of FIG. 2 in which the two pins 16 are held in their outward position by a spring 25 in the tubular member 14. The detent pins are thus retractable and also tapered as shown so that the meter can be readily installed over the retaining pin 14. Once plugged in, of course, the detent pins will prevent unplugging of the meter itself without damage to the assembly and also pulling the spring 19 out from the reed springs 17 such that the mechanism is tripped piercing the bag 20 allowing the fluid to indicate tampering as by soaking into the absorbant pad 22.

In FIG. 3 the spring 19 together with the arming wire 20 are shown in the position as when the device is being assembled into the watthour meter prior to being armed such that the arming wire 20 extends through a plate 26 to prevent movement of the spring 19 prior to its being assembled with the reed springs 17.

The tampering indicating system of the invention can readily be retrofitted to existing meters by drilling and tapping the base 12, and installing the retaining pin subassembly. The meter may be retrofitted at the factory. The main spring subassembly may be attached to the glass cover as by gluing the subassembly base member 23 to the glass cover. The hole or opening to accommodate the retaining pin 14 along with an additional opening to accommodate the arming wire 20 are drilled in the meter mechanism mounting base 11. The cover glass is then assembled on the mechanism mounting base with the arming wire extending therethrough and the pull ring attached. When the meter is installed, the reed springs are aligned and the meter is simply plugged in over the retaining pin with the spring 19 extending between the reed springs 17. When the arming wire 20 is removed from the member 26 the main spring 19 is retained by the reed springs 17.

In operation, it is easily seen that the glass cover 10 cannot be removed (or even be lifted more than a fraction of an inch) without releasing the spring 19. The detent pins prevent unplugging of the meter. The close proximity of a magnet of sufficient strength to affect the operation of the meter motor will be detected by the magnets 18 which, in turn, will cause the reed springs to rotate, thus releasing the main spring. The spring 19 may be tapered or made very thin in the vicinity of the reed springs so that they may easily rotate about it in response to externally applied magnetism.

Of course, once released, the main spring will fly back causing the tyne to puncture or break the vessel 21 and allowing the fluid to stain the pad 22 much like a sensitive mousetrap. The vessel 21 is preferably made of glass or a thin plastic material which is easily broken or punctured so that the spring 19 can be quite small.

The embodiments of the invention in which an exclusive property or right is claimed are defined as follows:

1. An apparatus for indicating meter tampering in a watthour meter having a base member, a metering mechanism fixed on a mechanism support member which plugs into the base member and a transparent cover fixed to the mechanism support member said apparatus comprising:
   retaining pin means fixed to said base member through said mechanism support member, said retaining pin means further comprising resiliently retained rectractable detent pin members disposed to allow said mechanism support member to slip over said retaining pin means and thereafter fixing said mechanism support member to said base;
   a pair of linear, parallel, spaced springs mounted in and supported by said retaining pin, said springs being free to rotate about an axis parallel thereto;
   main spring means including tyne means mounted on said cover and adapted to be retained between said pair of springs such that displacement of said main spring means relative to said pair of springs releases said main spring means;
   readily rupturable container means mounted on said cover and disposed so as to be struck by said tyne means upon release of said main spring means.

2. An apparatus according to claim 1 further comprising externally operable arming means for retaining said main spring during installation of said cover and arming said device upon installation of said meter.

3. An apparatus according to claim 1 further comprising magnet means mounted on each of said pair of linear, parallel, spaced springs said magnet means being adapted to cause rotation of said pair of linear, parallel, spaced springs upon reaction with an applied magnetic field having a strength above a predetermined threshold level.

4. An apparatus according to either one of claims 1 or 2 wherein said pair of springs are reed-type springs.

5. An apparatus according to claim 1 wherein said main spring is a coil spring.

6. An apparatus according to either one of claims 2 or 5 wherein said arming means is a wire adapted to retain said main spring through an opening in a member mounted adjacent said spring.

7. An apparatus according to either of claims 1 or 5 wherein said container is a plastic bag filled with a staining liquid.

8. An apparatus according to either of claims 1 or 5 wherein said container is a glass vial filled with a staining liquid.

9. An apparatus according to claim 8 further comprising an absorbant pad fixed beneath said container for absorbing said staining liquid.

10. An apparatus according to claim 8 further comprising an absorbant pad fixed beneath said container for absorbing said staining liquid.

* * * * *